United States Patent
Choi et al.

(10) Patent No.: US 7,242,605 B2
(45) Date of Patent: Jul. 10, 2007

(54) PHASE-CHANGE MEMORY DEVICE AND METHOD THAT MAINTAINS THE RESISTANCE OF A PHASE-CHANGE MATERIAL IN A RESET STATE WITHIN A CONSTANT RESISTANCE RANGE

(75) Inventors: Byung-gil Choi, Yongin-si (KR); Woo-yeong Cho, Hwaseong-si (KR); Hyung-rok Oh, Seongnam-si (KR); Beak-hyung Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 165 days.

(21) Appl. No.: 10/937,943

(22) Filed: Sep. 11, 2004

(65) Prior Publication Data

US 2005/0068804 A1   Mar. 31, 2005

(30) Foreign Application Priority Data

Sep. 25, 2003   (KR) .................. 10-2003-0066504

(51) Int. Cl.
   *G11C 11/00*   (2006.01)
(52) U.S. Cl. .................. 365/148; 365/113; 365/163; 365/186.07
(58) Field of Classification Search ............... 365/113, 365/148, 163, 189.07
   See application file for complete search history.

(56) References Cited

U.S. PATENT DOCUMENTS 6,314,014 B1 * 11/2001 Lowrey et al. ............. 365/100
6,545,903 B1 * 4/2003 Wu ............................ 365/148
6,768,665 B2 * 7/2004 Parkinson et al. .......... 365/113
2003/0081445 A1   5/2003 Van Brocklin et al.

FOREIGN PATENT DOCUMENTS

JP   2002-203392   7/2002

OTHER PUBLICATIONS

Kang-Deog Suh, et al., "A 3.3V 32Mb NAND Flash Memory With Incremental Step Pulse Programming Scheme", IEEE International Solid-State Circuits Conference; Digest of Technical Papers, Dec. 30, 1995.

* cited by examiner

*Primary Examiner*—Hoai V. Ho
(74) *Attorney, Agent, or Firm*—F. Chau & Assocs., LLC

(57) ABSTRACT

Provided are a phase-change memory device and method that maintains a resistance of a phase-change material in a reset state within a constant resistance range. In the method, data is provided to a first phase-change memory cell and then it is first determined whether data stored in the first phase-change memory cell and the data provided to the first phase-change memory cell are identical. If the data stored in the first phase-change memory cell and the data provided to the first phase-change memory cell are not identical, a complementary write current is provided to the first phase-change memory cell and it is second determined whether the data stored in the first phase-change memory cell and the data provided to the first phase-change memory cell are identical. If the data stored in the first phase-change memory cell and the data provided to the first phase-change memory cell are identical, data is provided to a second phase-change memory cell.

5 Claims, 9 Drawing Sheets

PHASE-CHANGE MEMORY DEVICE AND METHOD THAT MAINTAINS THE RESISTANCE OF A PHASE-CHANGE MATERIAL IN A RESET STATE WITHIN A CONSTANT RESISTANCE RANGE

CROSS-REFERENCE TO RELATED APPLICATION

This application claims priority to Korean Patent Application No. 2003-66504, filed on Sep. 25, 2003, in the Korean Intellectual Property Office, the disclosure of which is incorporated herein in its entirety by reference.

BACKGROUND OF THE INVENTION

1. Technical Field

The present invention relates to a phase-change memory device, and more particularly, to a phase-change memory device and method that maintains the resistance of a phase-change material used in the memory device within a constant resistance range in a reset state.

2. Discussion of the Related Art

Phase-change random access memories (PRAMs) are non-volatile memory devices that store data using a phase-change material, e.g., Ge—Sb—Te (GST), whose resistance changes upon a phase transition due to a change in temperature.

The phase-change material of a PRAM cell goes into a crystalline state or an amorphous state depending on the temperature and duration of heating applied to the phase-change material, thereby storing data in the PRAM cell. In general, a high temperature above 900° C. is required for a phase transition of the phase-change material to occur. Such high temperatures are obtained by Joule heating caused by current flowing through the PRAM cell.

A write operation for the phase-change material will now be explained. First, the phase-change material is heated above its melting temperature by a current flowing through the phase-change material, and then it is rapidly cooled. Next, the phase-change material goes into the amorphous state and stores data, e.g., "1". This state is referred to as a reset state. The phase-change material is then heated above its crystallization temperature for a predetermined period of time, and cooled. Next, the phase-change material goes into the crystalline form and stores data, e.g., "0". This state is referred to as a set state.

A read operation for the phase-change material will now be explained. After a bit line and a word line are selected to select a memory cell using the phase-change material, an external current is provided to the selected memory cell. It is then determined whether data stored in the selected memory cell is, e.g., "1" or "0", based on a voltage change caused by a resistance of the phase-change material of the selected memory cell.

The operation of writing data to a phase-change memory cell (e.g., a memory cell using a phase-change material) is initiated by Joule heating, which increases or decreases in proportion to a width of a bottom contact that contacts the phase-change material. Due to various reasons, however, such as defects arising during manufacturing, the widths of the bottom contacts that contact the phase-change materials may be non-uniform depending on the positions of the memory cells of a phase-change memory cell array. In addition, in memory cells having non-uniform bottom contact widths, phase-change materials do not completely enter the reset state. Thus, during the read operation, the resistances of the phase-change materials in the reset state may be non-uniform, causing failures during the read operation.

FIG. 1 shows a phase-change memory cell array 100 and positions of unit cells A, B, and C. FIGS. 2A through 2C illustrate different widths of bottom contacts that contact phase-change materials in the unit cells A, B, and C, respectively of FIG. 1. In particular, FIG. 2A illustrates a phase-change material and a bottom contact in the unit cell A of FIG. 1, FIG. 2B illustrates a phase-change material and a bottom contact in the unit cell B of FIG. 1, and FIG. 2C illustrates a phase-change material and a bottom contact in the unit cell C of FIG. 1.

It can be seen from FIGS. 2A through 2C that the widths of the bottom contacts that contact the phase-change materials may vary from cell to cell due to manufacturing defects. As shown in FIGS. 2A through 2C, the width (i) of the bottom contact that contacts the phase-change material in FIG. 2A is the smallest, the width (iii) of the bottom contact that contacts the phase-change material in FIG. 2C is the largest, and the width (ii) of the bottom contact that contacts the phase-change material in FIG. 2B is larger than the width (i) and smaller than the width (iii). Thus, when a phase-change material of a unit cell transits to the reset state due to the application of the reset current to the phase-change material, a contact resistance decreases as a width of a bottom contact that contacts the phase-change material increases. As a result, a transition to the reset state is delayed.

FIG. 3 is a graph illustrating a reset resistance range with respect to the position of a phase-change memory cell. In FIG. 3, it is assumed that a set resistance range of a phase-change material extends from 10 to 20KΩ and a reset resistance range of the phase-change material extends from 40 to 50KΩ. As can be seen from FIG. 3, when the same reset current is provided to, for example, the unit cells A, B, and C of FIG. 1, reset resistances vary among the unit cells A, B, and C.

The reset resistances of the unit cell A corresponding to FIG. 2A and the unit cell B corresponding to FIG. 2B lie in or above an average resistance range 40 to 50KΩ in the reset state. However, the reset resistance of the unit cell C corresponding to FIG. 2C showing the largest width (iii) lies below the average resistance range 40 to 50KΩ in the reset state. Thus, during an operation of reading data from the unit cells A and B, the states (e.g., the reset states) of the unit cells A and B can be sensed normally. However, during an operation of reading data from the unit cell C, the normal sensing operation cannot be performed and sensing failures may occur during the read operation.

As such, due to manufacturing defects, the widths of bottom contacts that contact phase-change materials may vary among different unit cells in a phase-change memory cell array. Thus, the phase-change materials of the unit cells in a reset state have different resistances and failures may occur during read operations.

SUMMARY OF THE INVENTION

According to an aspect of the present invention, there is provided a method of maintaining a resistance of a phase-change material in a reset state within a constant resistance range, the method comprises: providing data to a first phase-change memory cell; first determining whether data stored in the first phase-change memory cell and the data provided to the first phase-change memory cell are identical; if the data stored in the first phase-change memory cell and the data provided to the first phase-change memory cell are not identical, providing a complementary write current to the first phase-change memory cell and second determining whether the data stored in the first phase-change memory cell and the data provided to the first phase-change memory cell are identical; and providing data to a second phase-change memory cell if the data stored in the first phase-change memory cell and the data provided to the first phase-change memory cell are identical. The data provided to the first phase-change memory cell is reset data.

The steps of first and second determining whether the data stored in the first phase-change memory cell and the data provided to the first phase-change memory cell are identical each comprise: latching the data provided to the first phase-change memory cell; sensing the data stored in the first phase-change memory cell; and comparing the sensed data with the latched data. The complementary write current is increased when it is provided to the first phase-change memory cell.

According to another aspect of the present invention, there is provided a phase-change memory device comprising a write driver, a data sensing unit, a comparing unit, and a pulse control unit. The write driver receives data, provides the data to a phase-change memory cell, and provides a complementary write current to the phase-change memory cell in response to first through $n^{th}$ current control signals.

The data sensing unit senses data stored in the phase-change memory cell and outputs a logic value of the data stored in the phase-change memory cell as a cell data signal. The comparing unit determines whether the data provided to the phase-change memory cell and the data stored in the phase-change memory cell are identical in response to the cell data signal and outputs a comparison result as a detection signal.

The pulse control unit generates the first through $n^{th}$ current control signals in response to the detection signal and a pulse signal. The phase-change memory device may further comprise a latch unit which latches the data provided to the phase-change memory cell.

The pulse control unit outputs the first through $n^{th}$ current control signals in response to the pulse signal if a logic level of the detection signal is at a first level, and does not output the first through $n^{th}$ current control signals if the logic level of the detection signal is at a second level.

The complementary write current is increased in response to the first through $n^{th}$ current control signals. The detection signal is generated at the first level if the data provided to the phase-change memory cell and the data stored in the phase-change memory cell are not identical, and the detection signal is generated at the second level if the data provided to the phase-change memory cell and the data stored in the phase-change memory cell are identical.

The data provided to the phase-change memory cell is reset data. The write driver stores the data in the phase-change memory cell in response to the data and a reset pulse, receives the first through $n^{th}$ current control signals that are at the first level, increases an amount of the complementary write current, and provides the increased complementary write current to the phase-change memory cell.

The write driver comprises a first current control unit and a second current control unit. The first current control unit maintains a voltage level at a first node at the first level in response to a bias voltage, alters the voltage level at the first node to the second level in response to the data and the reset pulse, and provides the data to the phase-change memory cell. The second current control unit is turned off if the voltage level at the first node is at the first level, increases the complementary write current in response to the reset pulse and the first through $n^{th}$ current control signals that are at the first level, and outputs the increased complementary write current.

According to still another aspect of the present invention, there is provided a method of maintaining a resistance of a phase-change material in a reset state within a constant resistance range, the method comprises: providing reset data to a first phase-change memory cell; sensing data stored in the first phase-change memory cell; determining whether the sensed data and the data provided to the first phase-change memory cell are identical; providing a complementary write current to the first phase-change memory cell until the sensed data and the data provided to the first phase-change memory cell are identical; and providing the reset data to a second phase-change memory cell if the sensed data and the data provided to the first phase-change memory cell are identical. The complementary write current is increased when it is provided to the first phase-change memory cell.

According to yet another aspect of the present invention, there is provided a write driver including a first current control unit and a second current control unit. The first current control unit provides data to a phase-change memory cell in response to the data and a reset pulse. The second current control unit provides a complementary write current to the phase-change memory cell in response to first through $n^{th}$ current control signals if data stored in the phase-change memory cell and the data provided to the phase-change memory cell are not identical.

The first current control unit maintains a voltage level at a first node at a first level in response to a bias voltage, alters the voltage level at the first node to a second level in response to the data and the reset pulse, and provides the data to the phase-change memory cell.

The first through $n^{th}$ current control signals are generated at the first level if the data provided to the phase-change memory cell and the data stored in the phase-change memory cell are not identical, and the first through $n^{th}$ current control signals are generated at the second level if the data provided to the phase-change memory cell and the data stored in the phase-change memory cell are identical.

BRIEF DESCRIPTION OF THE DRAWINGS

The above aspects of the present invention will become more apparent by describing in detail exemplary embodiments thereof with reference to the attached drawings, in which.

DETAILED DESCRIPTION OF EXEMPLARY EMBODIMENTS

Figure 1:
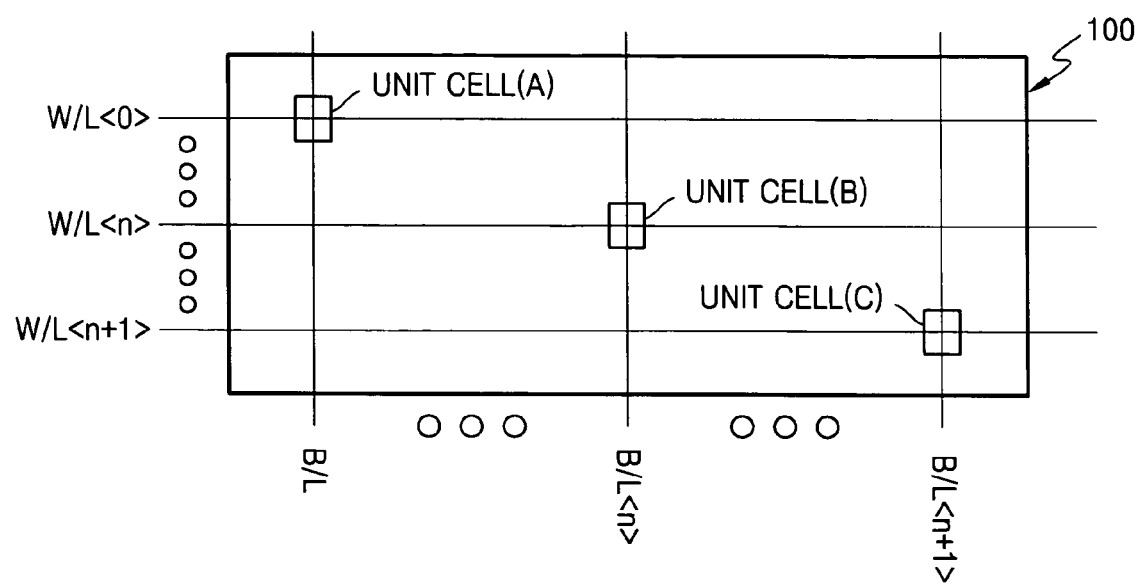
FIG. 1 shows a phase-change memory cell array and positions of unit cells in the phase-change memory cell array.
Figure 2A:
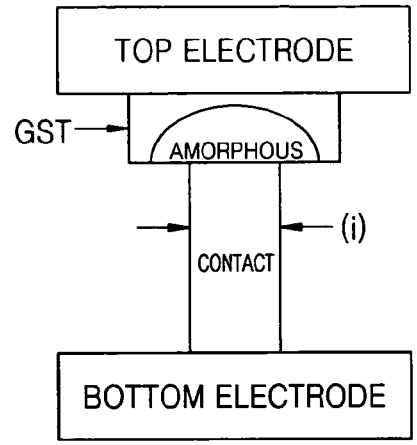
FIGS. 2A through 2C illustrate different widths of bottom contacts that contact phase-change materials in the unit cells of FIG. 1.
Figure 2B:
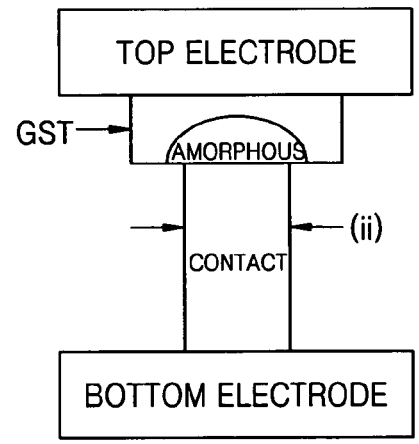
Figure 2C:
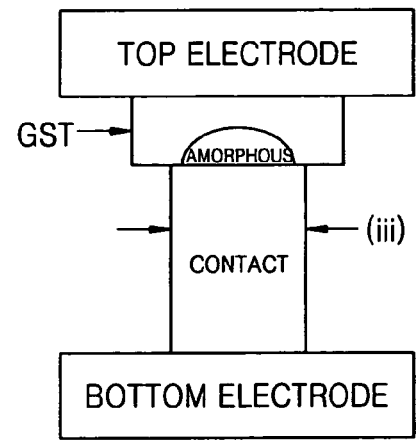
Figure 3:
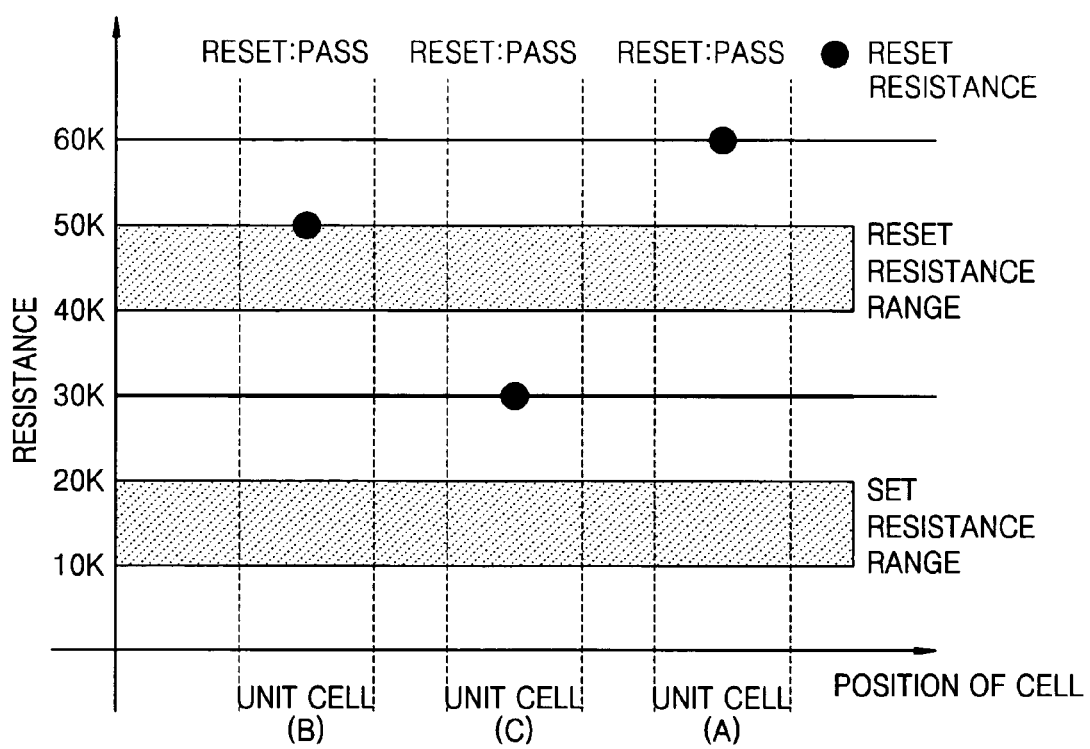
FIG. 3 is a graph illustrating a resistance range with respect to positions of the unit cells of FIG. 1 in a reset state.
Figure 4:
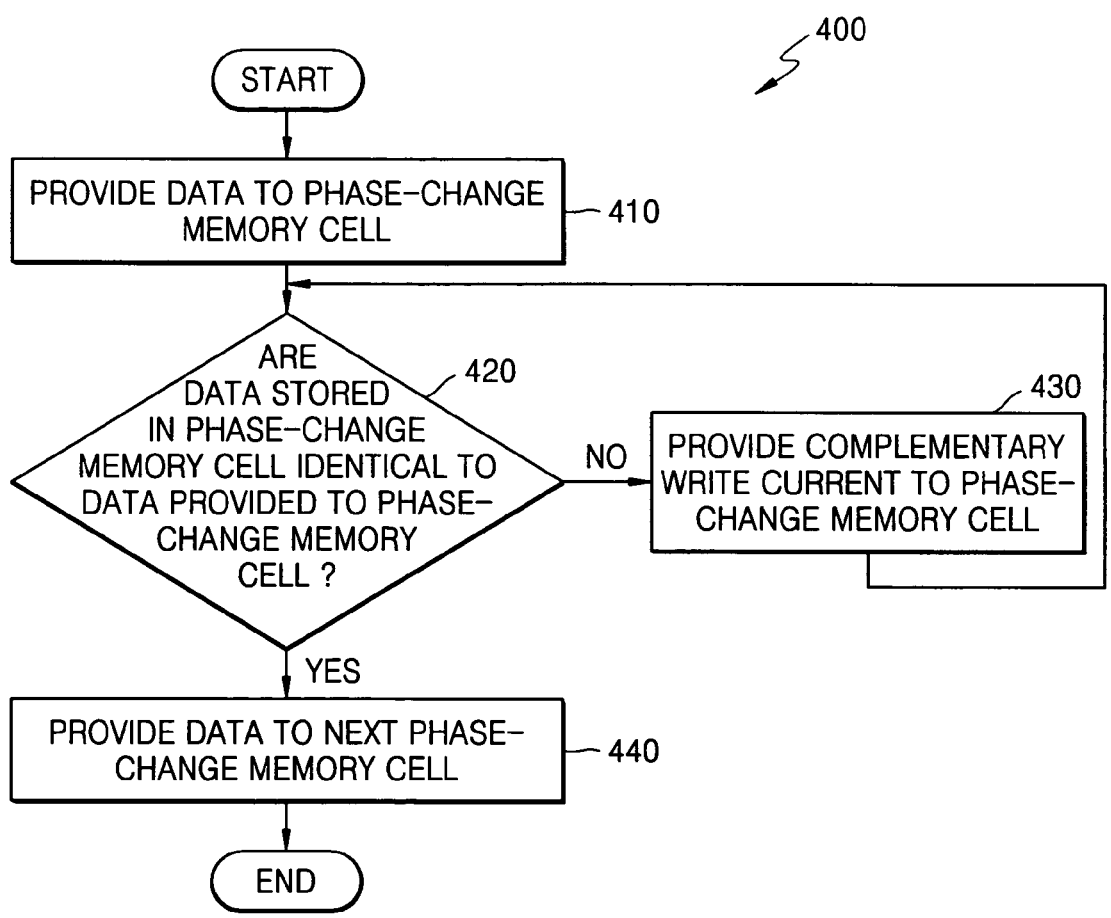
FIG. 4 is a flowchart illustrating a method of maintaining a resistance of a phase-change material in a reset state within a constant resistance range, according to an exemplary embodiment of the present invention.

FIG. 4 is a flowchart illustrating a method 400 of maintaining a resistance of a phase-change material in a reset state within a constant resistance range, according to an exemplary embodiment of the present invention.

According to the method 400, reset data for causing a phase-change material of a phase-change memory cell to enter a reset state is provided to the phase-change memory cell, and then it is determined whether the phase-change memory cell has entered the reset state. During this time, current is provided to the phase-change material until the phase-change material has gone into the reset state. If it is determined that the phase-change material has gone into the reset state, reset data is provided to another phase-change memory cell.

As shown in FIG. 4, in step 410, data is provided to a phase-change memory cell. Here, the data is reset data. Step 410 is performed to enable the phase-change memory cell to stabilize in the reset state irrespective of the width of a bottom contact that contacts the phase-change material.

In step 420, it is determined whether data stored in the phase-change memory cell is identical to the data provided to the phase-change memory cell. Step 420 includes latching and storing the data provided to the phase-change memory cell, sensing the data stored in the phase-change memory cell, and comparing the sensed data with the latched data.

Because the data provided to the phase-change memory cell is reset data, it has, for example, a logic value "1". If the phase-change material of the phase-change memory cell has transited to the reset state in response to the reset data, the sensed data would also have a logic value "1". If, however, a contact resistance decreases due to a large width of a bottom contact that contacts a phase-change material of a phase-change memory cell, the phase-change material cannot transit to the reset state. Then the sensed data would have, for example, a logic value "0".

If the data stored in the phase-change memory cell is not identical to the data provided to the phase-change memory cell, a complementary write current of a predetermined amount is provided to the phase-change memory cell in step 430 and the process goes back to step 420. If the sensed data has a logic value "0", the phase-change material has not transited to the reset state. Thus, the complementary write current is provided to the phase-change memory cell. Then, the data stored in the phase-change memory cell is sensed again and it is determined whether the sensed data is identical to the data provided to the phase-change memory cell.

If the sensed data is not identical to the data provided to the phase-change memory cell, the complementary write current is provided to the phase-change memory cell. The amount of complementary write current is greater than that of the complementary write current that was previously provided to the phase-change memory cell. In other words, the amount of the complementary write current is increased by a predetermined amount every time the complementary write current is provided to the phase-change memory cell.

In step 440, if the data stored in the phase-change memory cell is identical to the data provided to the phase-change memory cell, data is provided to the next phase-change memory cell.

Figure 5:
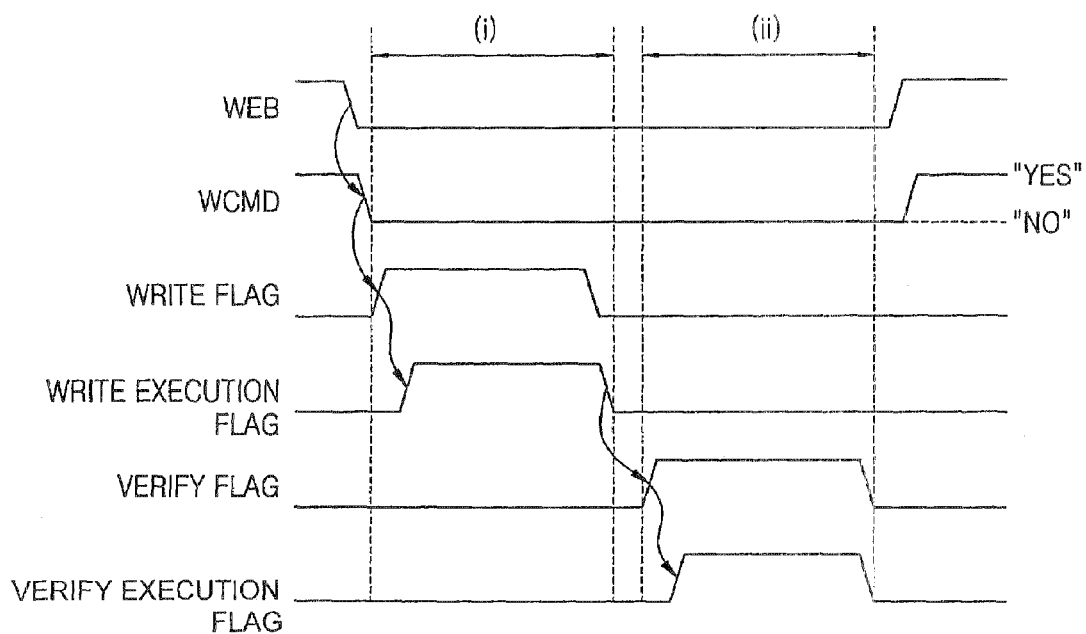
FIG. 5 is a timing diagram illustrating the method of FIG. 4.
Figure 6:
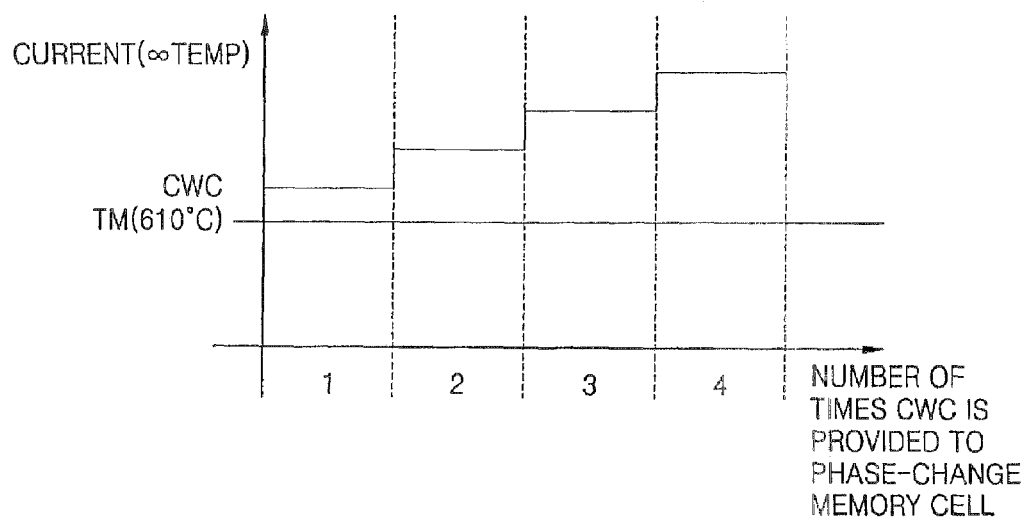
FIG. 6 is a graph illustrating a complementary write current that is provided to a phase-change memory cell.

FIG. 5 is a timing diagram illustrating the method 400 of FIG. 4. FIG. 6 is a graph illustrating a complementary write current that is provided to a phase-change memory cell.

Referring to FIG. 5, if a write enable signal WEB is generated at a low level, a write command WCMD is enabled at a low level and a write flag WRITE FLAG is generated at a high level. A write execution flag WRITE EXECUTION FLAG is generated in response to the write flag WRITE FLAG. While the write execution flag WRITE EXECUTION FLAG is at a high level, data is written to a phase-change memory cell.

Once the write execution flag WRITE EXECUTION FLAG transits to a low level, the write operation is completed, and data stored in the phase-change memory cell is sensed. In this regard, a verify flag VERIFY FLAG for sensing and comparing operations is generated in response to a falling edge of the write execution flag WRITE EXECUTION FLAG and a verify execution flag VERIFY EXECUTION FLAG is generated in response to the verify flag VERIFY FLAG.

While the verify execution flag VERIFY EXECUTION FLAG is at a high level, the data provided to the phase-change memory cell and the sensed data are compared and information indicating whether the sensed data is identical to the data provided to the phase-change memory cell is generated. In response to the information, it is determined whether to provide a complementary write current CWC to the phase-change memory cell and whether to generate the write command WCMD at a high or low level.

Referring to FIG. 6, as the number of times the complementary write current CWC is provided to a phase-change memory cell increases, the complementary write current CWC also increases.

Figure 7:
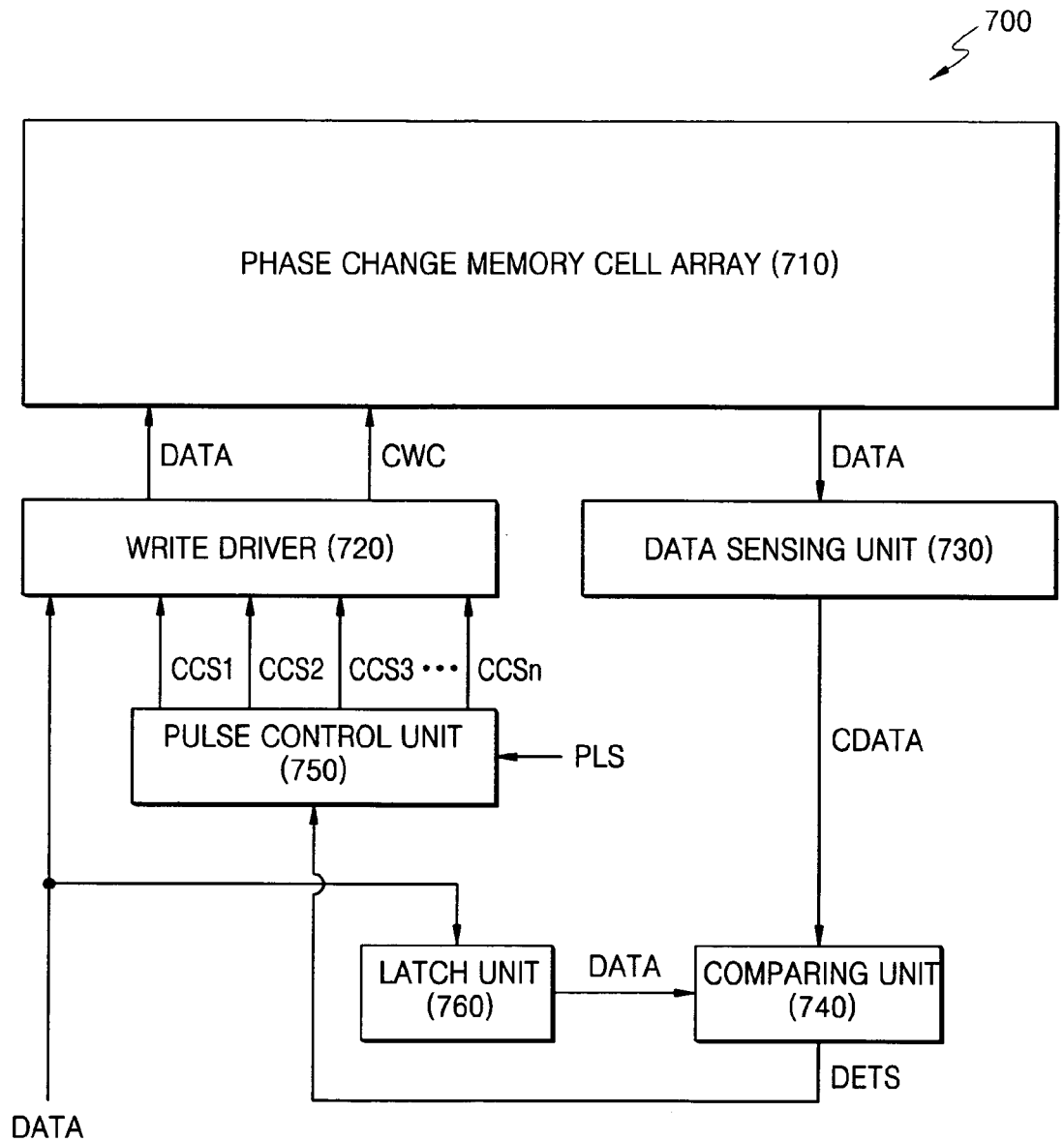
FIG. 7 is a block diagram of a phase-change memory device according to another exemplary embodiment of the present invention.

FIG. 7 is a block diagram of a phase-change memory device 700 according to another exemplary embodiment of the present invention. The phase-change memory device 700 includes a phase-change memory cell array 710, a write driver 720, a data sensing unit 730, a comparing unit 740, and a pulse control unit 750.

The write driver 720 receives data DATA and provides the data DATA to a phase-change memory cell of the phase-change memory cell array 710. The write driver 720 provides a complementary write current CWC to the phase-change memory cell in response to one of first through $n^{th}$ current control signals CCS1 through CCSn. The data DATA provided to the phase-change memory cell is reset data. The write driver 720 will be described later.

The data sensing unit 730 senses the data DATA stored in the phase-change memory cell and outputs a logic value of the sensed data and stores the data as a cell data signal CDATA. The data sensing unit 730 may be a sense amplifying circuit.

If a current corresponding to the reset data is provided to the phase-change memory cell and a phase-change material of the phase-change memory cell transits to a reset state, the cell data signal CDATA output from the data sensing unit 730 has the same logic value as that of the reset data, e.g., a logic value "1". If, however, the width of a bottom contact that contacts the phase-change material of the phase-change memory cell is larger than the width of a bottom contact that contacts the phase-change material in other phase-change memory cells, the phase-change material of the phase-change memory cell to which the reset data is provided cannot transit to the reset state. If so, the cell data signal CDATA output from the data sensing unit 730 has a logic value "0", which is different from that of the reset data.

The comparing unit 740 determines whether the data DATA provided to the phase-change memory cell and the data DATA stored in the phase-change memory cell are identical by comparing the data DATA provided to the phase-change memory and the cell data signal CDATA and outputs the comparison result as a detection signal DETS.

The phase-change memory device 700 may further include a latch unit 760 that latches the data DATA provided to the phase-change memory cell. The comparing unit 740 determines whether the data DATA stored in the latch unit 760 and the data DATA stored in the phase-change memory cell are identical.

Because the data DATA stored in the latch unit 760 is reset data, it has a logic value "1". If the cell data signal CDATA has a logic value "1", the data DATA stored in the latch unit 760 and the data DATA stored in the phase-change memory cell are identical. Then the comparing unit 740 outputs the detection signal DETS at a second level.

If the cell data signal CDATA has a logic value "0", the data DATA provided to the phase-change memory cell and the data DATA stored in the phase-change memory cell are not identical. Then the comparing unit 740 outputs the detection signal DETS at a first level. Here, it is assumed that the first level is at a high level and the second level is at a low level. It is to be understood, however, that the present invention is not limited to this assumption.

The pulse control unit 750 generates the first through $n^{th}$ current control signals CCS1 through CCSn in response to the detection signal DETS and a pulse signal PLS. If the detection signal DETS is at the first level, the pulse control unit 750 outputs the first through $n^{th}$ current control signals CCS1 through CCSn sequentially in response to the pulse signal PLS. If the detection signal DETS is at the second level, the pulse control unit 750 does not output the first through $n^{th}$ current control signals CCS1 through CCSn. In other words, the pulse control unit 750 only operates when the data DATA stored in the latch unit 760 and the data DATA stored in the phase-change memory cell are not identical.

Figure 8A:
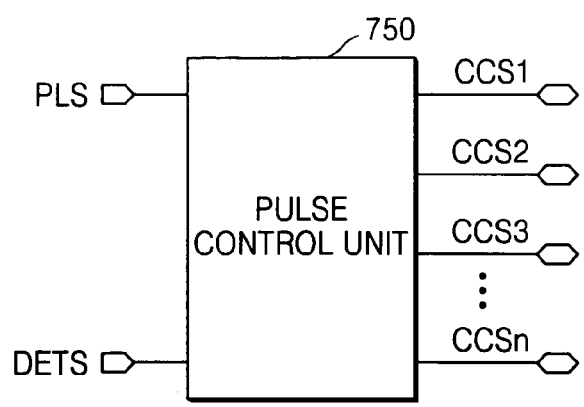
FIG. 8A is a block diagram of a pulse control unit of FIG. 7.
Figure 8B:
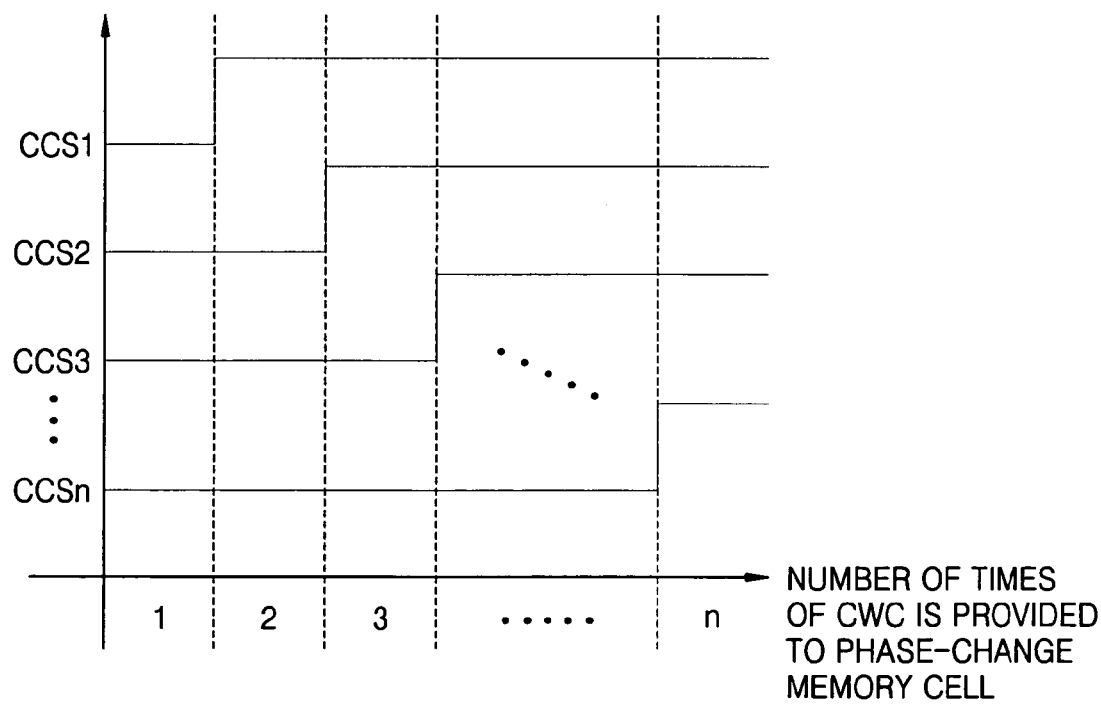
FIG. 8B illustrates waveforms of first through $n^{th}$ current control signals output from the pulse control unit of FIG. 7.

FIG. 8A is a block diagram of the pulse control unit 750 of FIG. 7. FIG. 8B illustrates waveforms of the first through $n^{th}$ current control signals CCS1 through CCSn output from the pulse control unit 750 of FIG. 7.

The detection signal DETS turns the pulse control unit 750 on or off. When the detection signal DETS is at the first level, the pulse control unit 750 is turned on. When the detection signal DETS is at the second level, the pulse control unit 750 is turned off.

After the data DATA is first provided to the phase-change memory cell, if it is determined that the data DATA provided to the phase-change memory cell and the data DATA stored in the phase-change memory cell are not identical, i.e., when the detection signal DETS is generated at the first level, the pulse control unit 750 outputs the first current control signal CCS1.

The pulse control unit 750 generates a waveform like that of the first current control signal CCS1 using the pulse signal PLS. The write driver 720 provides the complementary write current CWC to the phase-change memory cell to which the data DATA is first provided, in response to the first current control signal CCS1. Then Joule heating of the phase-change material of the phase-change memory cell increases, and a phase transition to the reset state progresses.

The data sensing unit 730 again senses the data DATA stored in the phase-change memory cell in which the phase-change material is transiting to the reset state and the comparing unit 740 compares the data DATA stored in the latch unit 760 with the newly sensed data DATA. If it is determined that the data DATA provided to the phase-change memory cell and the data DATA stored in the phase-change memory cell are not identical, the pulse control unit 750 outputs the second current control signal CCS2 in response to the detection signal DETS.

The pulse control unit 750 simultaneously provides the first current control signal CCS1 and the second current control signal CCS2 to the write driver 720. The write driver 720 provides the complementary write current CWC to the phase-change memory cell to which the data DATA is first provided, in response to the first current control signal CCS1 and the second current control signal CCS2.

In this case, the amount of complementary write current CWC is greater than the amount of complementary write current CWC that is provided to the phase-change memory cell in response to only the first current control signal CCS1. In other words, the amount of complementary write current CWC is increased by a predetermined amount as more of the first through $n^{th}$ current control signals CCS1 through CCSn are activated, and then the increased amount of complementary write current CWC is provided to the phase-change memory cell.

As the amount of complementary write current CWC increases, Joule heating of the phase-change material of the phase-change memory cell increases, and a phase transition to the reset state progresses. In this way, by causing the phase-change material of the phase-change memory cell, which incompletely transits to the amorphous state, to completely transit to the reset state, the resistance of the phase-change memory cell in the reset state can be maintained to be within a constant resistance range.

If the phase-change memory cell transits to the reset state, the cell data signal CDATA would have a logic value "1" and the detection signal DETS would be at the second level. Then the data DATA is written to the next phase-change memory cell.

Figure 9:
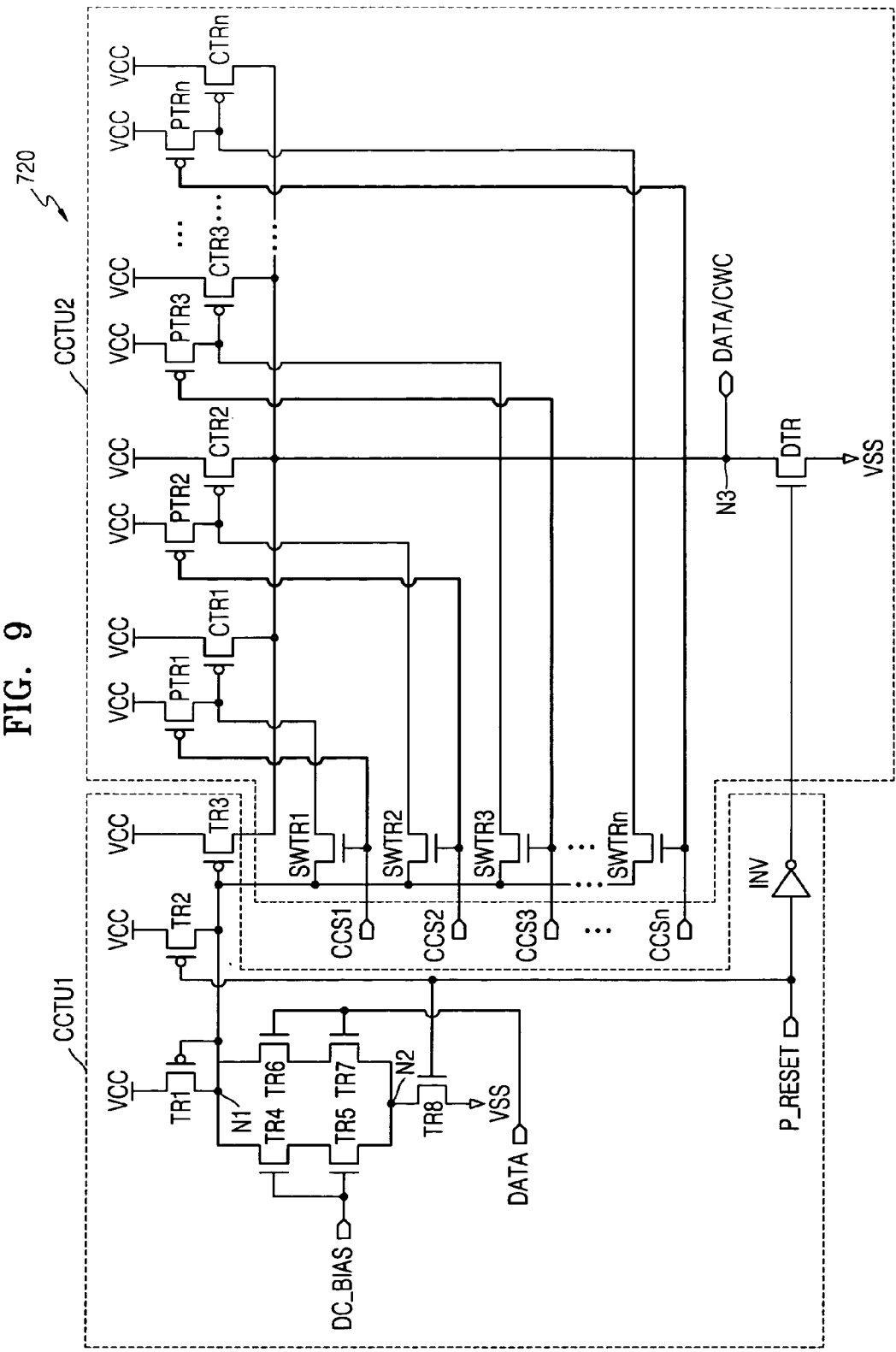
FIG. 9 is a circuit diagram of a write driver of FIG. 7.

FIG. 9 is a circuit diagram of the write driver 720 of FIG. 7. The operation and configuration of the write driver 720 will be now explained with reference to FIG. 9.

The write driver 720, which stores the data DATA in the phase-change memory cell in response to the data DATA and a reset pulse P_RESET, receives at least one of the first through $n^{th}$ current control signals CCS1 through CCSn that are at the first level, sequentially increases the amount of complementary write current CWC as the number of received current control signals CCS1 through CCSn at the first level increases, and provides the complementary write current CWC of the increased amount to the phase-change memory cell. More specifically, the write driver 720 includes a first current control unit CCTU1 and a second current control unit CCTU2.

The first current control unit CCTU1 maintains a voltage level at a first node N1 at the first level in response to a bias voltage DC_BIAS and alters the voltage level at the first node N1 to the second level in response to the data DATA and the reset pulse P_RESET, thereby providing the data DATA to the phase-change memory cell.

The second current control unit CCTU2 is turned off when the voltage level at the first node N1 is the first level. When the voltage level at the first node N1 is at the second level, the second current control unit CCTU2 increases the amount of complementary write current CWC in response to an inverted signal of the reset pulse P_RESET and at least one of the first through $n^{th}$ current control signals CCS1 through CCSn at the first level and outputs the increased complementary write current CWC.

The first current control unit CCTU1 includes first through eighth transistors TR1 through TR8 and an inverter INV. The first terminal of the first transistor TR1 is connected to a supply voltage VCC and the gate and the second terminal of the first transistor TR1 are connected to the first node N1. The first terminal of the second transistor TR2 is connected to the supply voltage VCC. The reset pulse P_RESET is input to the gate of the second transistor TR2. The second terminal of the second transistor TR2 is connected to the first node N1. The first terminal of the third transistor TR3 is connected to the supply voltage VCC. A gate of the third transistor TR3 is connected to the first node N1. The second terminal of the third transistor TR3 is connected to a third node N3.

The fourth transistor TR4 and the fifth transistor TR5 are serially connected between the first node N1 and a second node N2. The bias voltage DC_BIAS is input to the gates of the fourth transistor TR4 and the fifth transistor TR5. The sixth transistor TR6 and the seventh transistor TR7 are serially connected between the first node N1 and the second node N2. The data DATA is input to the gates of the sixth transistor TR6 and the seventh transistor TR7.

The eighth transistor TR8 is connected between the second node N2 and a ground voltage VSS. The reset pulse P_RESET is input to a gate of the eighth transistor TR8. The inverter INV inverts the reset pulse P_RESET and outputs the inverted signal of the reset pulse P_RESET.

The second current control unit CCTU2 includes first through $n^{th}$ switch transistors SWTR1 through SWTRn, first through $n^{th}$ control transistors CTR1 through CTRn, first through $n^{th}$ precharge transistors PTR1 through PTRn, and a driving transistor DTR.

The first terminals of the first through $n^{th}$ switch transistors SWTR1 through SWTRn are connected to the first node N1. The first through $n^{th}$ current control signals CCS1 through CCSn are input to corresponding gates of the first through $n^{th}$ switch transistors SWTR1 through SWTRn, respectively. The gates of the first through $n^{th}$ control transistors CTR1 through CTRn are connected to the second terminals of the first through $n^{th}$ switch transistors SWTR1 through SWTRn, respectively. The first terminals of the first through $n^{th}$ control transistors CTR1 through CTRn are connected to the supply voltage VCC. The second terminals of the first through $n^{th}$ control transistors CTR1 through CTRn are connected to the third node N3.

The first terminals of the first through $n^{th}$ precharge transistors PTR1 through PTRn are connected to the supply voltage VCC. The second terminals of the first through $n^{th}$ precharge transistors PTR1 through PTRn are connected to corresponding gates of the first through $n^{th}$ control transistors CTR1 through CTRn, respectively. The first through $n^{th}$ current control signals CCS1 through CCSn are input to the gates of the first through $n^{th}$ precharge transistors PTR1 through PTRn.

A first terminal of the driving transistor DTR is connected to the third node N3 and a second terminal of the driving transistor DTR is connected to the ground voltage VSS. The inverted signal of the reset pulse P_RESET is input to the gate of the driving transistor DTR. The complementary write current CWC is output through the third node N3.

The reset pulse P_RESET is activated when reset data is received. The data DATA received by the first current control unit CCTU1 is the reset data. Thus, the reset pulse P_RESET is activated when the reset data is received.

The bias voltage DC_BIAS turns on the fourth transistor TR4 and the fifth transistor TR5. Because the reset pulse P_RESET is at a low level until the data DATA is received, the second transistor TR2 maintains the voltage level at the first node N1 at the first level, i.e., a high level. Once the data DATA is received, the sixth transistor TR6 and the seventh transistor TR7 are turned on, and the eighth transistor TR8 is turned on and the second transistor TR2 is turned off in response to the reset pulse P_RESET. Then the voltage level of the first node N1 is altered to a low level and the third transistor TR3 is turned on.

Because the third transistor TR3 is turned on, the data DATA is output at a high level through the third node N3. The output data DATA is stored in the phase-change memory cell. At this time, the first through $n^{th}$ current control signals CCS1 through CCSn are maintained at a low level. If it is determined by the comparing unit 740 that the data DATA provided to the phase-change memory cell and the data sensed by the sensing unit 730 are not identical, the pulse control unit 750 generates the first current control signal CCS1 at a high level in response to the detection signal DETS.

Then the first switch transistor SWTR1 is turned on and the first precharge transistor PTR1 is turned off. Because the first node N1 is at a low level, the first control transistor CTR1 whose gate is connected to the first node N1 through the first switch transistor SWTR1 is turned on and outputs current through the third node N3. The output current is the complementary write current CWC. The output complementary write current CWC is provided to the phase-change memory cell to which the data DATA is provided, thus making the phase transition to the reset state progress. In this way, the second through $n^{th}$ current control signals CCS2 through CCSn are activated and the complementary write current CWC is provided to the phase-change memory cell until the phase-change material transits to the reset state.

Figure 10:
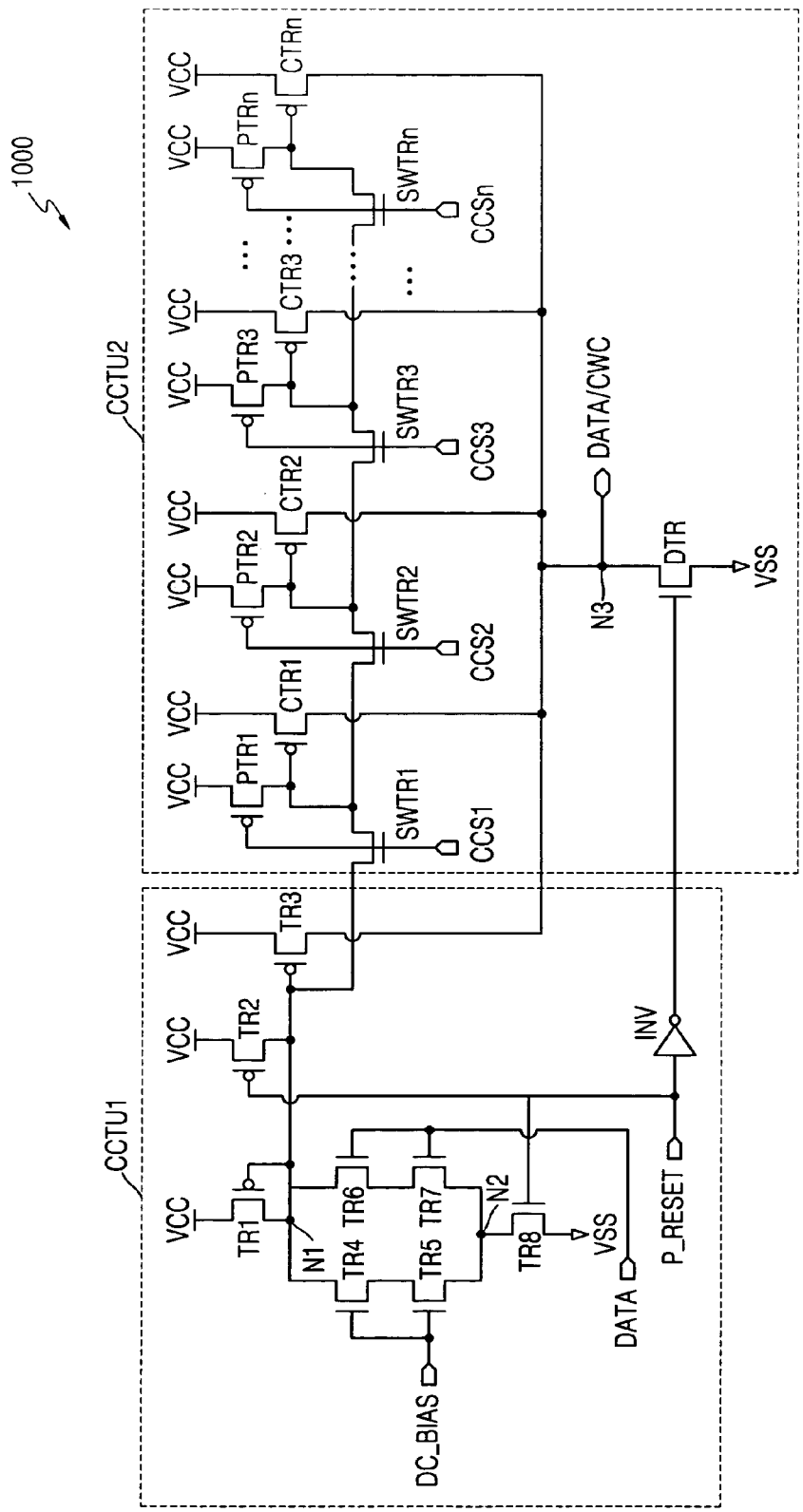
FIG. 10 is a circuit diagram of a write driver according to yet another exemplary embodiment of the present invention.

FIG. 10 is a circuit diagram of a write driver 1000 according to yet another exemplary embodiment of the present invention.

Referring to FIG. 10, the configuration and function of a first current control unit CCTU1 are the same as those of the first current control unit CCTU1 of FIG. 9. However, the configuration and function of a second current control unit CCTU2 of FIG. 10 is different from that of the second current control unit CCTU2 of FIG. 9. Therefore, the following description will be focused on the configuration and function of the second current control unit CCTU2 of FIG. 10.

The second current control unit CCTU2 includes first through $n^{th}$ switch transistors SWTR1 through SWTRn, first through $n^{th}$ control transistors CTR1 through CTRn, first through $n^{th}$ precharge transistors PTR1 through PTRn, and a driving transistor DTR.

The first through $n^{th}$ switch transistors SWTR1 through SWTRn are serially connected between a first node N1 and the gate of the $n^{th}$ control transistor CTRn. The first through $n^{th}$ current control signals CCS1 through CCSn are input to the gates of the first through $n^{th}$ switch transistors SWTR1 through SWTRn, respectively.

The gates of the first through $n^{th}$ control transistors CTR1 through CTRn are connected to the second terminals of the first through $n^{th}$ switch transistors SWTR1 through SWTRn, respectively. The first terminals of the first through $n^{th}$ control transistors CTR1 through CTRn are connected to the supply voltage VCC, and the second terminals of the first through n$^{th}$ control transistors CTR1 through CTRn are connected to a third node N3.

The first terminals of the first through n$^{th}$ precharge transistors PTR1 through PTRn are connected to the supply voltage VCC, and the second terminals of the first through n$^{th}$ precharge transistors PTR1 through PTRn are connected to the gates of the first through n$^{th}$ control transistors CTR1 through CTRn. The first through n$^{th}$ current control signals CCS1 through CCSn are connected to the gates of the first through n$^{th}$ precharge transistors PTR1 through PTRn.

The first terminal of the driving transistor DTR is connected to the third node N3 and the second terminal of the driving transistor DTR is connected to the ground voltage VSS. The inverted signal of the reset pulse P_RESET is input to the gate of the driving transistor DTR. A complementary write current CWC is output through the third node N3.

The first through n$^{th}$ switch transistors SWTR1 through SWTRn of the second current control unit CCTU2 of FIG. 10 are serially connected to the first node N1 in contrast to the first through n$^{th}$ switch transistors SWTR1 through SWTRn of the second current control unit CCTU2 of FIG. 9.

To turn on the n$^{th}$ control transistor CTRn of FIG. 10, a low-level signal at the first node N1 should pass through the first through n$^{th}$ switch transistors SWTR1 through SWTRn. Thus, it takes longer to turn on the n$^{th}$ control transistor CTRn of FIG. 10 than the time required to turn on the n$^{th}$ control transistor CTRn of FIG. 9. In other words, longer delays occur when turning on the first through n$^{th}$ switch transistors SWTR1 through SWTRn of the second current control unit CCTU2 of FIG. 10, as compared to the first through n$^{th}$ switch transistors SWTR1 through SWTRn of the second current control unit CCTU2 of FIG. 9. Because the operating principle of the second current control unit CCTU2 of FIG. 10 is similar to that of the second current control unit CCTU2 of FIG. 9, it will not described here.

As described above, a phase-change memory device and method which maintains a resistance of a phase-change material in a reset state within a constant resistance range enables the resistances of phase-change materials in phase-change memory cells in a reset state to be maintained within a constant resistance range even when the widths of the bottom contacts that contact phase-change materials vary among different phase-change memory cells.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A method of maintaining a resistance of a phase-change material in a program operation within a constant resistance range, the method comprising;
   providing data to a first phase-change memory cell;
   first determining whether data stored in the first phase-change memory cell and the data provided to the first phase-change memory cell are identical;
   if the data stored in the first phase-change memory cell and the data provided to the first phase-change memory cell are not identical, providing a complementary write current to the first phase-change memory cell that increases based on a number of times it is provided to the first phase-change memory cell and second determining whether the data stored in the first phase-change memory cell and the data provided to the first phase-change memory cell are identical; and
   providing data to a second phase-change memory cell if the data stored in the first phase-change memory cell and the data provided to the first phase-change memory cell are identical.

2. The method of claim 1, wherein the data provided to the first phase-change memory cell is reset data.

3. The method of claim 1, wherein the steps of first and second determining whether the data stored in the first phase-change memory cell and the data provided to the first phase-change memory cell are identical each comprise:
   latching the data provided to the first phase-change memory cell;
   sensing the data stored in the first phase-change memory cell; and
   comparing the sensed data with the latched data.

4. A method of maintaining a resistance of a phase-change material in a program operation within a constant resistance range, the method comprising:
   providing reset data to a first phase-change memory cell;
   sensing data stored in the first phase-change memory cell;
   determining whether the sensed data and the data provided to the first phase-change memory cell are identical;
   providing a complementary write current to the first phase-change memory cell that increases based on a number of times it is provided to the first phase-change memory cell until the sensed data and the data provided to the first phase-change memory cell are identical; and
   providing the reset data to a second phase-change memory cell if the sensed data and the data provided to the first phase-change memory cell are identical.

5. A method of maintaining a resistance of a phase-change material in a program operation within a constant resistance range, the method comprising;
   providing data to a first phase-change memory cell;
   first determining whether data stored in the first phase-change memory cell and the data provided to the first phase-change memory cell are identical;
   if the data stored in the first phase-change memory cell and the data provided to the first phase-change memory cell are not identical, providing a first complementary write current to the first phase-change memory cell and second determining whether the data stored in the first phase-change memory cell and the data provided to the first phase-change memory cell are identical;
   if the data stored in the first phase-change memory cell and the data provided to the first phase-change memory cell are not identical after providing the first complementary write current, providing a second complementary write current to the first phase-change memory cell that is greater than the first complementary write current and third determining whether the data stored in the first phase-change memory cell and the data provided to the first phase-change memory cell are identical; and
   providing data to a second phase-change memory cell if the data stored in the first phase-change memory cell and the data provided to the first phase-change memory cell are identical.

* * * * *